US009366706B2

(12) United States Patent
Poupyrev et al.

(10) Patent No.: US 9,366,706 B2
(45) Date of Patent: Jun. 14, 2016

(54) SYSTEM AND METHOD FOR SENSING HUMAN ACTIVITY BY MONITORING IMPEDANCE

(71) Applicant: Disney Enterprises, Inc., Burbank, CA (US)

(72) Inventors: Ivan Poupyrev, Pittsburgh, PA (US); Zhiquan Yeo, New York, NY (US); Jonas Loh, Berlin (DE)

(73) Assignee: Disney Enterprises, Inc., Burbank, CA (US)

( * ) Notice: Subject to any disclaimer, the term of this patent is extended or adjusted under 35 U.S.C. 154(b) by 589 days.

(21) Appl. No.: 13/726,893

(22) Filed: Dec. 26, 2012

(65) Prior Publication Data

US 2013/0113506 A1  May 9, 2013

Related U.S. Application Data

(63) Continuation of application No. 13/078,028, filed on Apr. 1, 2011, now Pat. No. 8,975,900.

(60) Provisional application No. 61/322,084, filed on Apr. 8, 2010.

(51) Int. Cl.
*G01R 27/04* (2006.01)
*G01R 27/32* (2006.01)
*G01R 27/02* (2006.01)
(Continued)

(52) U.S. Cl.
CPC .............. *G01R 27/02* (2013.01); *G06F 3/011* (2013.01); *G06F 3/046* (2013.01); *G06F 3/0416* (2013.01)

(58) Field of Classification Search
CPC ....................... G01N 27/02; G01N 2011/0066
USPC .......... 324/633, 300, 334, 655, 658, 675, 708
See application file for complete search history.

(56) References Cited

U.S. PATENT DOCUMENTS 3,493,883 A * 2/1970 Mead et al. ........................ 331/4
3,601,717 A * 8/1971 Kuecken .................... H03J 3/00
330/51

(Continued)

FOREIGN PATENT DOCUMENTS

CN    1312050 A    9/2001
CN    101014395 A    8/2007
(Continued)

OTHER PUBLICATIONS

Patent Cooperation Treaty, PCT/US2011/031573, International Search Report dated Oct. 13, 2011.
(Continued)

*Primary Examiner* — Huy Q Phan
*Assistant Examiner* — Giovanni Astacio-Oquendo
(74) *Attorney, Agent, or Firm* — Patterson + Sheridan LLP

(57) ABSTRACT

A system for sensing human activity by monitoring impedance includes a signal generator for generating an alternating current (AC) signal, the AC signal applied to an object, a reactance altering element coupled to the AC signal, an envelope generator for converting a returned AC signal to a time-varying direct current (DC) signal, and an analog-to-digital converter for determining a defined impedance parameter of the time-varying DC signal, where the defined impedance parameter defines an electromagnetic resonant attribute of the object.

17 Claims, 8 Drawing Sheets

(51) Int. Cl.
    *G06F 3/01* (2006.01)
    *G06F 3/041* (2006.01)
    *G06F 3/046* (2006.01)

(56) References Cited

U.S. PATENT DOCUMENTS

| | | | | |
|---|---|---|---|---|
| 4,005,399 | A * | 1/1977 | Pazemenas | G08B 25/06 340/538 |
| 4,112,365 | A * | 9/1978 | Larson et al. | 324/173 |
| 4,501,020 | A * | 2/1985 | Wakeman | H03J 7/32 375/228 |
| 5,049,828 | A * | 9/1991 | Toliver | G01R 29/22 324/649 |
| 5,214,315 | A * | 5/1993 | Dunnam | H03K 17/74 327/109 |
| 5,684,367 | A * | 11/1997 | Moskowitz et al. | 315/246 |
| 5,986,549 | A * | 11/1999 | Teodorescu | 340/561 |
| 6,323,658 | B1 | 11/2001 | Kendig et al. | |
| 6,459,929 | B1 * | 10/2002 | Hopper et al. | 600/513 |
| 6,593,753 | B2 * | 7/2003 | Scott et al. | 324/637 |
| 6,690,156 | B1 | 2/2004 | Weiner et al. | |
| 6,690,181 | B1 | 2/2004 | Dowdeswell | |
| 2004/0155871 | A1 | 8/2004 | Perski et al. | |
| 2004/0251918 | A1 | 12/2004 | Cehelnik | |
| 2007/0085836 | A1 | 4/2007 | Ely | |
| 2008/0128180 | A1 | 6/2008 | Perski et al. | |
| 2008/0150550 | A1 | 6/2008 | Vos | |
| 2008/0150918 | A1 | 6/2008 | Hagen et al. | |
| 2008/0238885 | A1 | 10/2008 | Zachut et al. | |
| 2011/0248773 | A1 | 10/2011 | Poupyrev et al. | |
| 2012/0215163 | A1 * | 8/2012 | Hanson | A61M 5/1413 604/67 |

FOREIGN PATENT DOCUMENTS

| | | |
|---|---|---|
| CN | 101217273 A | 7/2008 |
| CN | 101419522 A | 4/2009 |
| JP | 58182743 * | 10/1983 |
| JP | 58182743 A | 10/1983 |
| WO | 2005121939 A2 | 12/2005 |
| WO | 2011127278 A1 | 10/2011 |

OTHER PUBLICATIONS

Zili Dai, Search Report for CN Application 2011800286520, State Intellectual Property Office of the People's Republic of China, 1 page, dated Oct. 29, 2015.

* cited by examiner

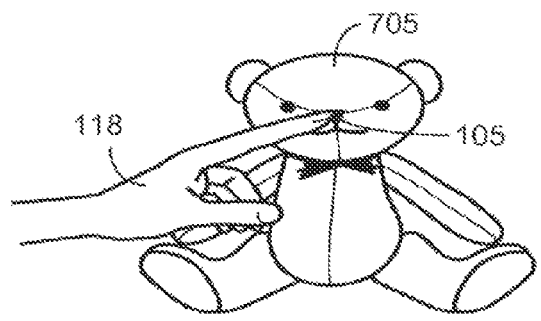
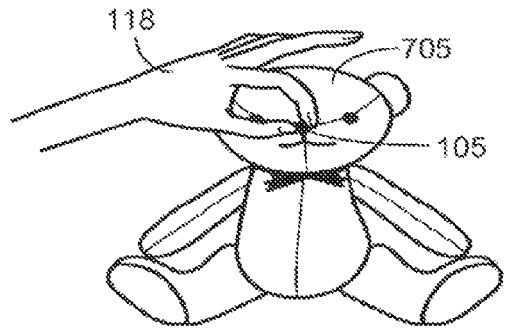
FIG. 7A  FIG. 7B
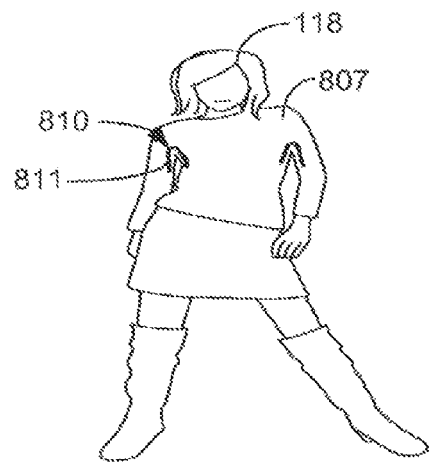
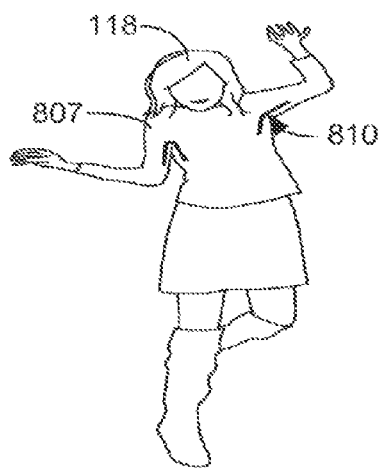
FIG. 8A  FIG. 8B

SYSTEM AND METHOD FOR SENSING HUMAN ACTIVITY BY MONITORING IMPEDANCE

CROSS-REFERENCE TO RELATED APPLICATIONS

This application is a continuation of co-pending U.S. patent application Ser. No. 13/078,028, filed Apr. 1, 2011 entitled "System and Method for Sensing Human Activities by Monitoring Impedance," which claims benefit of U.S. provisional patent application Ser. No. 61/322,084, filed Apr. 8, 2010. Each of the aforementioned related patent applications is herein incorporated by reference in its entirety.

BACKGROUND

Research and development in technologies for sensing human activity is at the forefront of an area known as human computer interaction (HCI). The term HCI refers broadly to any interaction between a computing system and a human being, and more particularly, to an interaction in which a human being communicates their intention to a computing system. One way a human being can communicate their intention to a computer system is by having the computer system sense the presence of the human being using a sensor. Examples of such sensors include a proximity sensor and a touch sensor. The desire to sense human activity and communicate human intention to a computer system is leading to the development of new technologies for enabling new types of human-computer interaction. Designing new interactive experiences is one example of a new type of human-computer interaction that exemplifies the need to develop new systems and methods for sensing human activity.

There are a number of different sensing methodologies for detecting the presence and type of human activity and interaction. A sensor is a transducer that converts a physical stimulus, such as light or motion, into a signal that can be measured. The application of the sensor depends on the physical phenomenon sought to be measured, e.g., resistance is measured in resistive touch panels, light intensity is measured in cameras and photo sensors, the direction and intensity of a magnetic field is measured in proximity sensors, acceleration is used to measure motion, and the amount of electrical charge can be used to measure a response of a multi-touch capacitive input device.

When implemented as part of a user interface, one or more sensors can be located in an input device associated with the user interface. The sensor or sensors can be worn by the user or can be embedded into objects and the environment with which the user comes into contact or proximity. Many types of sensors do not have fixed applications and can be used in a variety of applications. One area of HCI research explores using traditional sensor technology in new and creative ways. For example, while a magnetometer is typically used as a sensor for a compass, it can also be used to sense human gestures.

Therefore, it would be desirable to have a sensor that can be used to measure a variety of human actions and activity, such as proximity or touch, deformation and manipulation of objects and other actions that can be used to sense the presence and intention of a human being and that can be used as part of a user interface for a computer system.

SUMMARY

One embodiment disclosed herein is a system for sensing interaction. The system includes a signal generator producing a frequency-swept signal in an object. The system includes an impedance measurement component coupled to the object and configured to identify a change in an impedance parameter of the frequency-swept signal as an external body interacts with the object. The system further includes an interaction signal generator indicating a characteristic of an interaction between the object and the external body based upon the change in the impedance parameter.

Another embodiment disclosed herein is a method for sensing a body's interaction with an object. The method includes generating a frequency-swept signal within the object. The method includes identifying a change in an impedance parameter of the frequency-swept signal as the body interacts with the object and generating an interaction signal indicating a characteristic of an interaction between the body and the object based upon the change in the impedance parameter.

Another embodiment disclosed herein is an interactive object. The interactive object includes a body having a characteristic reactance and a first interface configured to couple the characteristic reactance to an external scanning impedance monitoring device. The interactive object also includes a second interface configured to couple to a reactance altering element, whereby the characteristic impedance coupled to the scanning impedance monitoring device is distinguishably altered when the second interface is coupled to a reactance altering element.

BRIEF DESCRIPTION OF THE DRAWINGS

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

FIGS. 7A and 7B are schematic diagrams collectively illustrating another example of a manner in which the system for sensing human activity by monitoring impedance can be used.

FIGS. 8A and 8B are schematic diagrams collectively illustrating another example of a manner in which the system for sensing human activity by monitoring impedance can be used.

DETAILED DESCRIPTION

Figure 1:
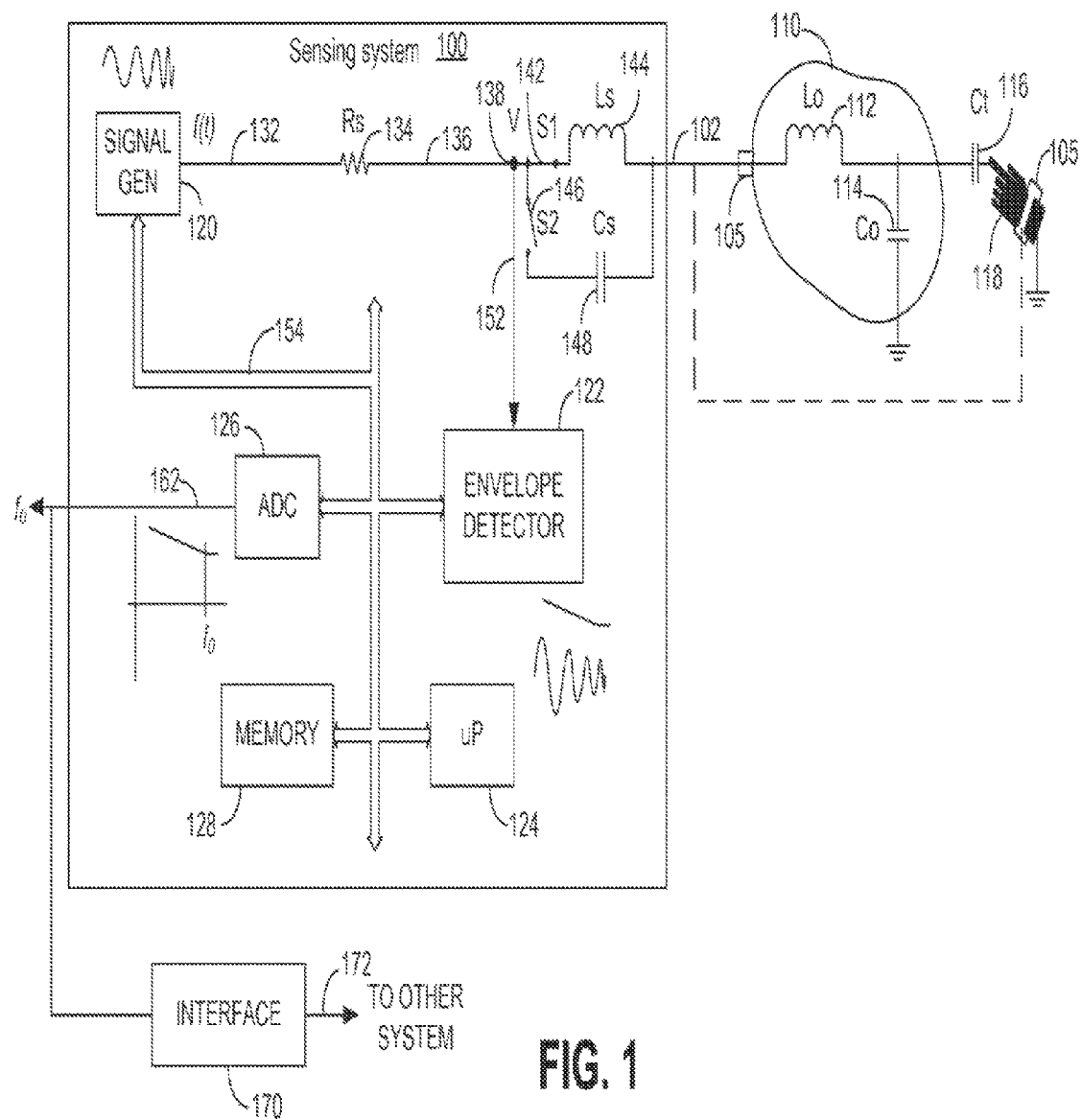
FIG. 1 is a block diagram illustrating an embodiment of a system for sensing human activity by monitoring impedance.

The system and method for sensing human activity by monitoring impedance is based on a physical phenomenon known as impedance. Impedance is generally defined as the total opposition a device or circuit offers to the flow of an alternating current (AC) at a given frequency. For many objects, the frequency at which the opposition to the flow of alternating current drops to its minimum is referred to as the object's resonant frequency. Resonant frequency is related to the effect of the electromagnetic resonance of an object. For some objects, the value of the impedance is minimal at the object's resonance frequency and for other objects the value of the impedance is maximal at the object's resonant frequency. Electromagnetic resonance has been widely used for tuning and filtering radio communication circuits, as well as for identifying and tagging objects. These uses assume that the resonant characteristics of the object are known ahead of time, whereby the user manipulates a specific tag or identification card. However, any system of conductive objects, including humans, has resonant properties that can be described by defined impedance parameters, such as resonant frequency, or other parameters. For these reasons, the electromagnetic resonance, and in particular, resonant frequency, can be used as an indicator for sensing human activity. Assuming that the electrical properties of the object or system are constant, any changes in the resonant properties of the object or system result from user activity or user interaction. Therefore, human interaction with the object or system can be detected by a) measuring the impedance of the system at various frequencies and generating what are referred to as "impedance curves" that are representative of the system's impedance over a range of frequencies, b) computing various resonant properties and other features from the impedance curves, and c) monitoring changes in the computed resonant properties of the object or system at different frequencies. Resonant properties include the resonant frequency of the object or system as well as other resonant properties, such as an amplitude of a measured signal at the resonant frequency, the profile of the peaks of the measured signal, as well as the presence of other peaks on an impedance curve.

Changes in the resonant properties of the object or system arise due to direct or indirect interaction between a user and the object or system. For example, by measuring changes in the resonant frequency of an object when a user interacts with the object, the type and extent of the interaction can be identified. The remainder of this description will generally focus on monitoring changes in the resonant frequency and other related impedance parameters of an object or system to determine the type of and extent of human interaction with the object or system. As used herein, the terms object and system will be used interchangeably to refer to an object or system, the impedance, and in an embodiment, the resonant frequency of which is sought to be measured and monitored to determine human interaction with the object or system.

Any electrical system with capacitive, inductive and resistive elements has a unique frequency at which an alternating current flowing through the system will reach a maximum or a minimum value, i.e., its resonant frequency. The maximum and minimum values could also take the form of local minimum and local maximum values. While many systems correspond to a minimum alternating current value at their resonant frequency, there are some systems that correspond to a maximum alternating current value at their resonant frequency. Both instances are contemplated herein, depending on the system. The system can be stimulated by applying a periodic electrical signal over a range of different frequencies, e.g. by performing a frequency sweep of the system. The amplitude of the alternating current reaches its minimum or maximum at the resonant frequency of the system, and can therefore be used as an indicator of the resonant frequency of the system.

Any interaction that affects the reactive properties of the system (i.e. capacitance or inductance) will change the impedance characteristics, and in an embodiment, the resonant frequency of the system. Assuming the electrical properties of the system remain constant, any changes in the resonant frequency will occur due to human activity or interaction with the system. Thus, it is possible to infer human interaction with the system by tracking changes in the resonant frequency of the system.

The resonant frequency of a circuit that includes capacitive, inductive and resistive properties can be generally described by Equation 1.

$$f_0 = \frac{1}{2\pi\sqrt{L \cdot C}} \qquad \text{Eq. 1}$$

where L is the inductance in C is the capacitance of the system. The resonant frequency of the system changes only when the system's inductance and capacitance are affected.

Capacitive interactions change the capacitive properties of the system. For example, a user touching a conductive object, such as a metal bracelet worn on a user's wrist, forms a capacitive link to ground, increasing capacitance and decreasing the resonant frequency of the bracelet. Another example of capacitive interaction is the physical reconfiguration of the object such as opening or closing a drawer in a metal cabinet. Such reconfiguration leads to changes in system capacitance and changes in the resonant frequency.

Inductive interactions change the inductive properties of the system. For example, stretching a metal spring will change its inductance, as the inductance depends on the distance between the turns of the spring. Changing the inductance changes the resonant frequency of the system. Accordingly, a sensor configured to determine the resonant frequency of an object or system should be sensitive to changes in the capacitance and inductance of the object or system.

FIG. 1 is a block diagram illustrating an embodiment of a system for sensing human activity by monitoring resonant frequency. The sensing system 100 is coupled to an object 110 over connection 102. In an embodiment, the connection 102 can be a single wire. An electrode 105 can be attached to the object 110, or can be attached to a human 118, depending on the application.

The object 110 can be any conductive object or system that has electromagnetic resonant properties and, in an embodiment, a resonant frequency characterized by an inductance (Lo) 112 and a capacitance (Co) 114. The inductance (Lo) 112 and the capacitance (Co) 114 can be known or unknown. The inductance (Lo) and the capacitance (Co) correspond to the inductance, L, and the capacitance, C, in Equation 1. To illustrate human interaction, a human 118 touches the object 110, in which the touch illustrates a capacitive contact between the human 118 and the object 110. The capacitance, Ct, 116 illustrates that the touch causes a change in the overall capacitive reactance of the object 110. A particular configuration of inductive and capacitive elements in the object 110 are provided as an example. In general the exact configuration may not be known and can be arbitrary and complex. However, the operation of the systems and methods described herein are not dependent on knowledge of the exact configuration of the inductive and capacitive elements in the object 110.

The sensing system 100 comprises a signal generator 120, an envelope detector 122, a microprocessor 124, an analog to digital converter 126, and a memory 128, coupled over a system bus 154. The system bus 154 can be any communications bus that allows interoperability and communication between and among the connected elements. The microprocessor 124 can be any general purpose or special-purpose processor that can execute the functions described herein. The memory 128 can be any type of static or dynamic memory, volatile or non-volatile memory, and can, in an embodiment, be used to store software related to the operation of the systems and methods described herein. The memory 128 can be either or both of local memory and/or memory located on other computing devices and that is accessible using various data transmission technologies, such as wired or wireless connection links. The memory is also used to store the results provided by the sensing system 100.

The signal generator 120 generates a time varying signal f(t), which is provided over connection 132. In an embodiment, the signal provided over connection 132 is a 1 KHz to 3.5 MHz, 10V peak-to-peak, sinusoidal frequency sweep, which is provided to a resistor 134. The resistor, Rs, 134 has a relatively small value and converts the alternating current on connection 132 to an alternating voltage on connection 136. The alternating voltage on connection 136 is provided through a node 138 to a first switch 142 and to a second switch 146. The switches 142 and 146 can be controlled manually, by the microprocessor 124 or by any circuitry that can be specific to the embodiments described. The first switch 142 is connected to a biasing inductor, Ls, 144, and the second switch 146 is connected to a biasing capacitor, Cs, 148. The switches 142 and 146 can be selectively opened and closed by the microprocessor 124, or by other logic or circuitry. For most objects, the capacitance, Co, 114 and the inductance, Lo, 112 are very small, resulting in a very high resonant frequency.

Both capacitive and inductive interactions with the object 110 affect the form of the impedance curve, as well as the width of local or global peaks in the impedance curve corresponding to resonant frequency i.e., it's Q-factor, with a resultant change in the resonant frequency of the object 110, or a change in other parameters To infer human interaction with the object 110 from changes in a measurable parameter, a correspondence between human interaction and the affected parameter should be established. Therefore, it could be preferable in some applications to block the effect of either capacitive or inductive interactions. Doing so ensures that changes in the resonant frequency, or Q-factor, are the result of changes in one, but not both types of interactions. For example, if it is desirable to measure the stretching of twisted wire, i.e. an inductive interaction, it would be desirable to remove the influence of the user touching the wire, which is a capacitive interaction and which would also affect the measurement of the resonant frequency.

Blocking the influence of inductive interactions can be accomplished by adding the biasing inductor, Ls, 144, and blocking the influence of capacitive interactions can be accomplished by adding the biasing capacitor, Cs, 148. In addition to blocking the influence of inductive and capacitive interactions, selectively introducing the biasing inductor, Ls, 144 and the biasing capacitor, Cs, 148 between the connection 136 and the connection 102 also shifts the resonant frequency of the entire system including the sensing system 100 and object 110 into a lower range that is more easily measured than a very high resonant frequency. For example, if it is desired to track capacitance changes in the system 110, a large value for the biasing inductor, Ls, 144 not only blocks the influence of inductive changes in the object 110, but also shifts the resonant frequency into a lower, more easily measurable range. Similarly, if it is desirable to track inductive changes in the object 110, a large biasing capacitor, Cs, 148 is switched into the system, thus blocking the influence of capacitive changes in the object 110 and shifting the resonant frequency into a lower, more easily measurable range. Generally, either the biasing inductor, Ls, 144 or the biasing capacitor, Cs, 148 will be connected to node 138 at a given time. The biasing inductor, Ls, 144 and the biasing capacitor, Cs, 148 can be referred to as reactance altering elements because they influence the AC voltage on node 138.

The large biasing inductor, Ls, 144 blocks inductive effects imparted to the object 110, thus enabling the measurement of small changes in capacitance. A large biasing capacitor, Cs, 148, blocks capacitive effects, thus enabling the measurement of small changes in inductance of the object 110.

In an embodiment, the alternating voltage at node 138 characterizes the resonant frequency of the object 110, including the effect imparted by the biasing inductor, Ls, 144 or the biasing capacitor, Cs, 148. The alternating voltage at node 138 is provided to an envelope detector 122. The envelope detector 122 generates a time varying DC signal that defines the amplitude of the alternating voltage at node 138. The signal on connection 152 represents a signal returned from the object 110. The time varying DC signal is provided to the analog to digital converter (ADC) 126. The analog to digital converter 126 processes the time varying DC signal provided by the envelope detector 122 to determine a local minimum, a local maximum, or other attribute of the measured signal. In an embodiment, the local minimum of the time varying DC signal corresponds to the resonant frequency, $f_0$, of the object 110. The signal representing the resonant frequency, $f_0$, is provided over connection 162 to systems external to the sensing system 100. In an embodiment, the signal, $f_0$, is provided to an interface 170. The interface 170 can be any interface that can use the information about the resonant frequency of the object 110. For example, the interface 170 can be a user interface that provides an input/output function to a computing device, a portable communication device, an interactive toy, a sensing system associated with an attraction at an amusement park, or any other computer-based interface. The output of the interface on connection 172 is shown as being provided to another system to signify that the output of the sensing system 100 can be used by a number of different systems in a number of different configurations.

The ability to accurately measure the resonant frequency of an object 110 with very small capacitance and inductance allows the resonant frequency of the object to be identified and tagged, thereby providing the ability to recognize the object 110 based on its resonant frequency. For example, the resonant frequency of the object 110 can be measured and stored in the memory 128 so that at a later time, the resonant frequency can be used to identify that object 110.

Figure 2A:
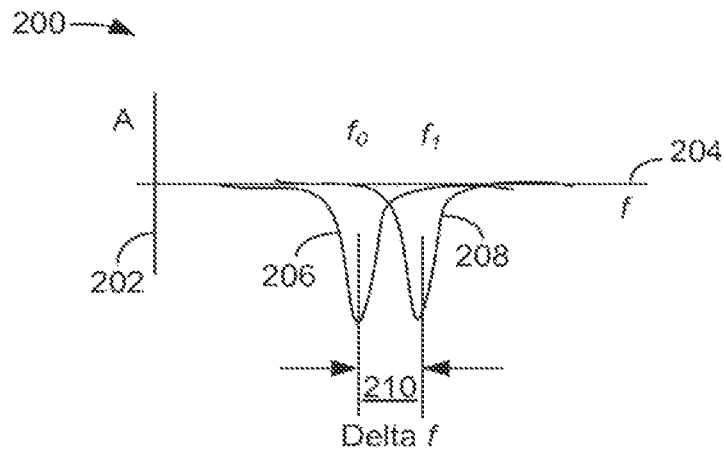
FIG. 2A is a graphical view illustrating an example of a measurable change in the resonant frequency of an object due to human interaction.

FIG. 2A is a graphical illustration 200 of an example of a measurable change in the resonant frequency of an object due to human interaction. The vertical axis 202 represents amplitude of a measured signal and the horizontal axis 204 represents frequency. A first resonant frequency trace 206 illustrates a measured signal that has a first resonant frequency $f_0$.

A second resonant frequency trace 208 illustrates a measured signal that has a second resonant frequency, referred to as f1. In an embodiment, the resonant frequency, $f_0$, can be the static resonant frequency of the object 110. The second resonant frequency, $f_1$, represents the resonant frequency of the object 110 while being touched by a human being 118. As shown in FIG. 2A, the change in the resonant frequency, referred to as Δf, 210, shows the effect of a human being interacting with the object 110 by touching the object 110. For example, if the object 110 is a wristwatch bracelet that is connected to the sensing system 100 with an electrode 105 over connection 102, the effect of a human being 118 touching the object 110 results in a change in the resonant frequency of the object by an amount shown in FIG. 2A as Δf. The ability of the sensing system 100 to measure this change in resonant frequency allows the sensing system 100 to be used as a user interface, or as part of a user interface that can communicate human interaction with the object 110 to other computing devices and computing systems.

Figure 2B:
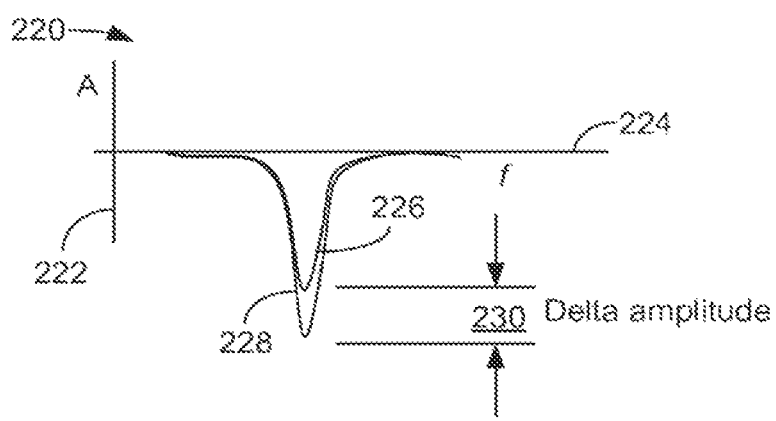
FIG. 2B is a graphical view illustrating an alternative measurable parameter of the object of FIG. 1.

FIG. 2B is a graphical view illustrating an alternative measurable parameter of the object of FIG. 1 that can be measured by the sensing system 100. The vertical axis 222 represents amplitude and the horizontal axis 224 represents frequency. A first resonant frequency trace 226 illustrates a measured signal that has a first resonant frequency $f_0$. A second resonant frequency trace 228 illustrates a measured signal that has a second resonant frequency, referred to as $f_1$. In this example, the first resonant frequency $f_0$ is substantially similar to the second resonant frequency $f_1$. In an embodiment, the resonant frequency, $f_0$, can be the static resonant frequency of the object 110. The second resonant frequency, $f_1$, represents the resonant frequency of the object 110 while being touched by a human being 118.

In FIG. 2B, a change in the amplitude from the first resonant frequency trace 226 to the second resonant frequency trace 228, referred to as Δamplitude 230 results from human interaction with the object 110. In this embodiment, amplitude is the defined impedance parameter and the amplitude difference, Δamplitude 230, can be measured by the ADC 126 and used to signify human interaction with the object 110. Further, a combination of frequency and amplitude can be measured and used to signify human interaction with the object 110.

Figure 3:
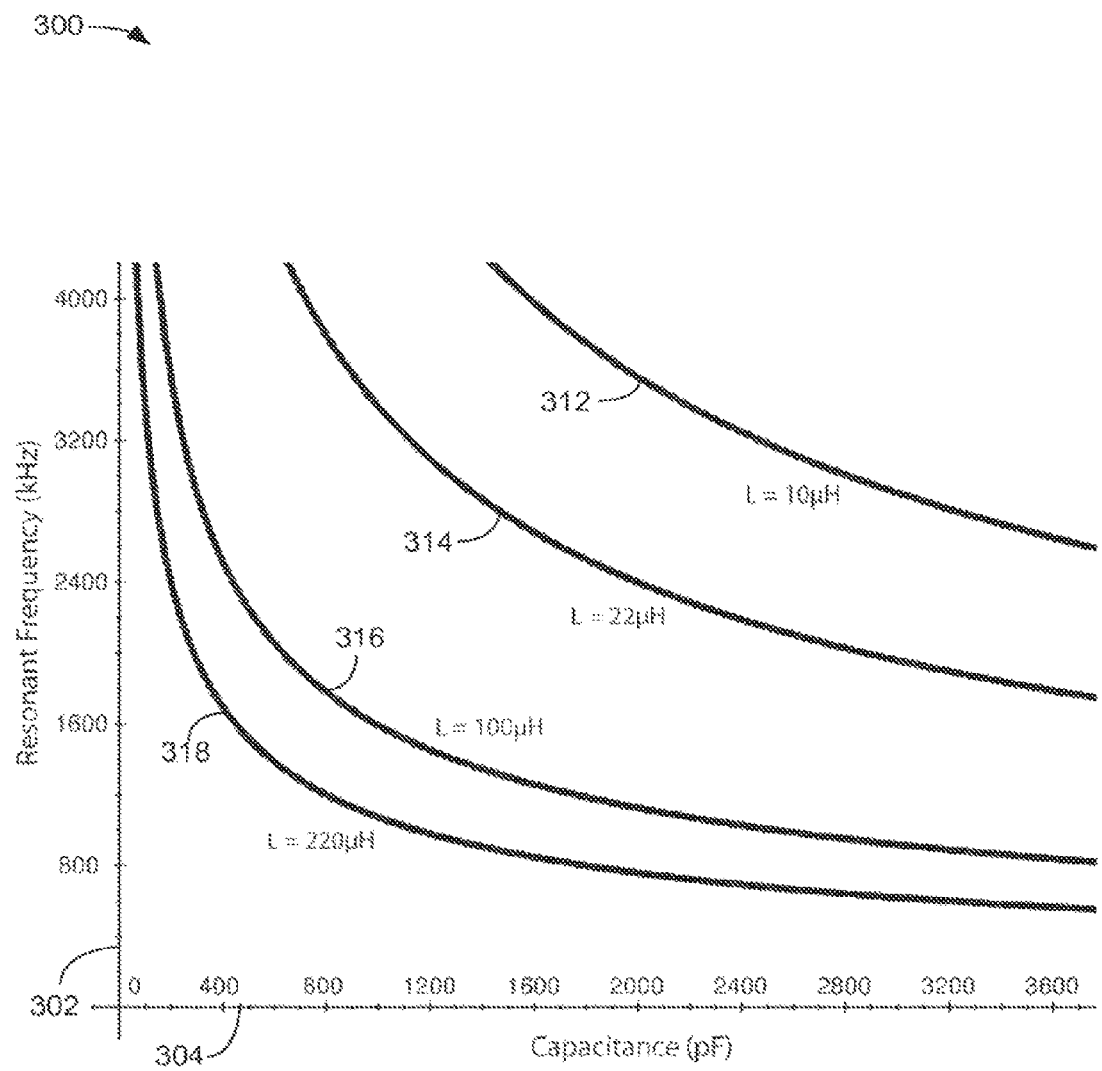
FIG. 3 is a graphical illustration showing the effect of a biasing inductor on the capacitance and resonant frequency of an object.

FIG. 3 is a graphical illustration 300 showing the effect of a biasing inductor on the capacitance and resonant frequency of an object. The vertical axis 302 represents resonant frequency in kHz and the horizontal axis 304 represents capacitance in pF. The traces 312, 314, 316 and 318 respectively show the effect of biasing inductance, Ls, 144 (FIG. 1) values of 10 μH, 22 μH, 100 μH and 220 μH. As inductance increases, the resonant frequency becomes more sensitive to small variations in capacitance in lower range of values as the resonant frequency drops. Therefore, small variations in capacitance can be measured at very small values while remaining in a lower range of resonant frequencies. At the same time it can be observed that as the value of inductance increases, the system becomes less sensitive to small changes in total inductance. Therefore, by including a large biasing inductor, the effect and influence of inductance can be effectively blocked. Blocking the inductance will ensure that changes in the resonant frequency can be measured by small capacitive interaction only. Alternatively, a large biasing capacitor can be used to block the influence of capacitance changes and allow the measurement of resonant frequency as a result of small changes in inductance.

Figure 4A:
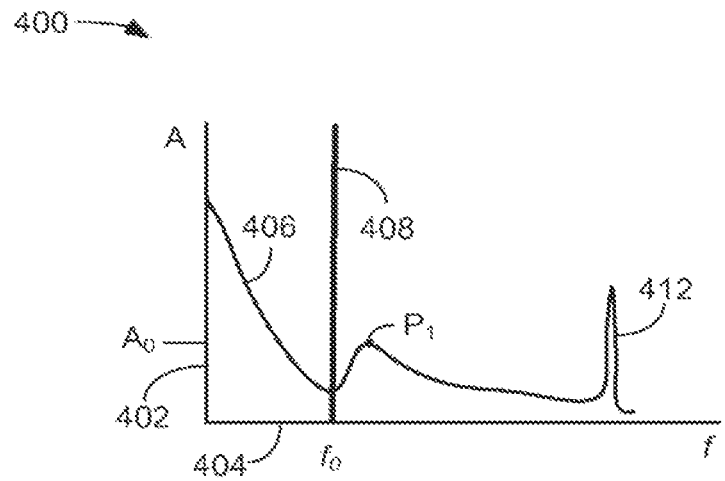
FIG. 4A is a graphical illustration showing an exemplary plot of the static resonant frequency of an object.

FIG. 4A is a graphical illustration 400 showing an exemplary plot of the static impedance of an object. The vertical axis 402 represents amplitude and the horizontal axis 404 represents frequency. The trace 406 illustrates a plot of the static impedance curve of the object 110. The term "static" impedance refers to the impedance of the object 110 with no human interaction. The trace 406 shows the static impedance curve of the object 110 over a range of different frequencies. The resonant frequency, fo, is illustrated at 408. The resonant frequency 408 can be stored in the memory 128 and can be associated with the object 110. Associating the resonant frequency 408 with the object 110 allows the identity of the object 110 to be saved and used at a subsequent time to identify the object 110.

Figure 4B:
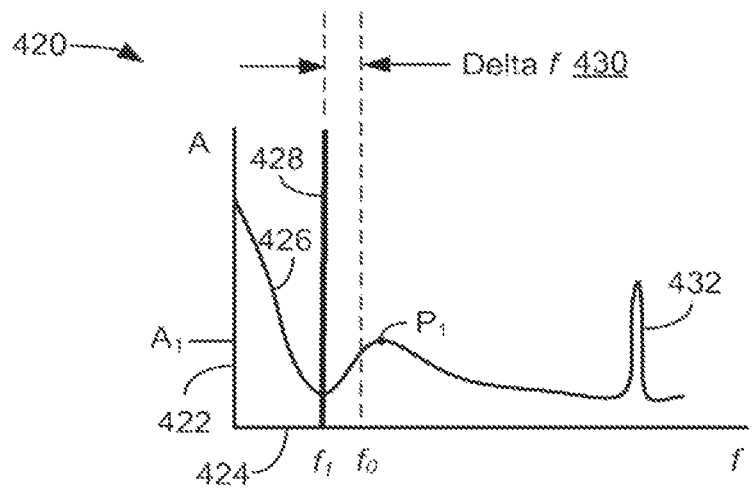
FIG. 4B is a graphical illustration showing an exemplary plot of the resonant frequency of the object of FIG. 4A after human interaction.

FIG. 4B is a graphical illustration 420 showing an exemplary plot of the impedance of the object of FIG. 4B during human interaction. The vertical axis 422 represents amplitude and the horizontal axis 424 represents frequency. The trace 426 illustrates a plot of the impedance curve of the object 110 during human interaction. The trace 426 shows the impedance curve of the object 110 over a spectrum of different frequencies and reflects changes in the static impedance curve of FIG. 4A shown by trace 406. The change in the impedance curve shown in trace 426 reflects changes in one or more impedance parameters of the object 110 resulting from human interaction. These changes result in a change in, for example, the resonant frequency, which changes from a value $f_0$ in FIG. 4A to a value of $f_1$ in FIG. 4B. Changes in other impedance parameters, such as amplitude, a combination of resonant frequency and amplitude, or other impedance parameters can also be monitored for change which can signify human interaction with the object 110. Other features of the impedance curve, such as differences in the amplitude, shape and width of a peak 412 (FIG. 4A) and a corresponding peak 432 (FIG. 4B), can be monitored for change, which can also signify human interaction.

As an example of human interaction with the object 110, when a user touches the object 110 with their finger, the user's finger creates a variable capacitance with the object. The capacitance can vary with the amount of pressure exerted by the user's finger on the object. As the user presses harder, the skin stretches and increases the area of touch, thereby increasing the capacitance, and thereby altering the trace 426. The resonant frequency, is the resonant frequency of the object 110 in response to the human interaction and is illustrated at 428. The difference in resonant frequency, Δf, 430, reflects the difference in resonant frequency between $f_0$ and $f_1$, and is indicative of the human interaction with the object 110. The value of $f_0$, $f_1$ and Δf can be stored in the memory 128 and used to identify the object 110 and the type of interaction with the object 110. In addition to the frequency, other parameters, such as, for example, the amplitude of the trace at a particular frequency can also be monitored for change that can signify human interaction. For example, a point, P1, on the trace 406 in FIG. 4A might occur at an amplitude, $A_0$. The point P1 may exhibit a change in amplitude, shown as $A_1$ in FIG. 4B, to signify human interaction, and further, to signify a degree of human interaction.

Figure 5:
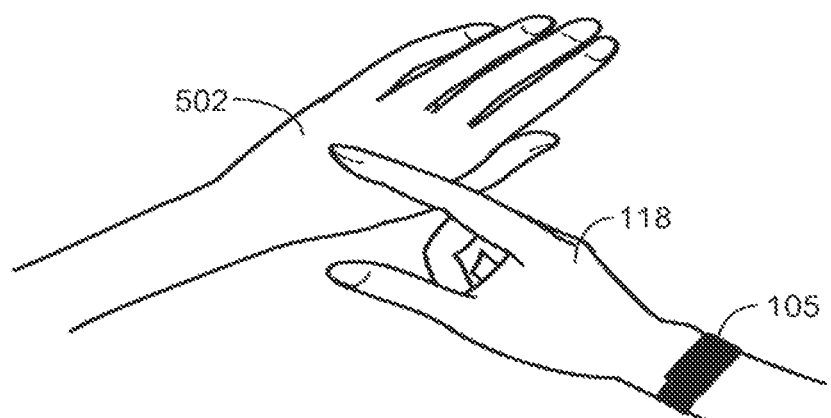
FIG. 5 is a schematic diagram illustrating a first example of a manner in which the system for sensing human activity by monitoring impedance can be used.

FIG. 5 is a schematic diagram illustrating a first example of a manner in which the system for sensing human activity by monitoring impedance can be used. The electrode 105 is attached to the user's body 118, such as to a finger or wrist. The sensing system 100 records changes of the parameters describing the impedance curve (FIGS. 4A and 4B) as the user touches various objects in the environment or changes their relation to the environment. In FIG. 5, the user 118 is touching their own body, such as another arm, fingers or a cheek, or in this example, their hand 502. The change in the measured impedance parameter or parameters depends on, for example, the extent to which the user 118 touches their own body, e.g. the area of contact and the force of contact. The measured impedance parameters can determine, for example, whether the user touches them self with one finger, with two fingers or with three fingers. The measured impedance parameters can also be used to determine how much pressure the user applies. The measured impedance parameters can be then mapped to correspond to various interaction actions. For example, tapping ones hand with one finger could start playback of a digital music player, while tapping ones hand with two fingers could stop playback of the digital music player. Other media devices, game devices, communication devices, appliances, etc., and their related functionality can be controlled in similar manner.

In another example, one or more of the parameters of a music synthesis device could be controlled by the user squeezing their own arm, where squeezing the arm stronger, for example, could increase the pitch of the sound. In another example, an external system can be controlled by clapping, where the sensing system 100 can recognize the extent to which the clapping hand is touching the other hand, e.g. if it is touching only with the tips of the finger or with the entire palm. This measured impedance characteristic can be then applied to control the device.

In another example the user 118 can distinguish which parts of their own body the user is touching, either by equipping the body with additional electrodes or by recognizing that different body parts have different electrical properties.

In other examples, the user may raise one or both feet from the ground. The change in measured impedance parameters could describe how much the user 118 raises their feet from the ground, as well as if the user raises one foot or both feet. The measured impedance parameters can be used to measure user state and can be saved to memory 128 (FIG. 1) and mapped to control at least some of the parameters of the interaction. For example, comparing the measured impedance parameters can determine whether the user is touching the ground with his feet, which allows the measurement of the number of steps the user has taken and other properties of locomotion. For example, comparing the measured impedance parameters can distinguish between running and walking.

The system and method for sensing human activity by monitoring impedance can also be used to distinguish different objects that the user may be touching or with which the user may be in proximity. Different objects could affect parameters of the impedance curves differently when the user touches them. Based on the measured impedance parameters, it is possible to distinguish how and to what extent the user is touching the object, e.g. how hard the user is touching the object, how many fingers are touching the object and so on. This is possible because the larger the area of contact with the object, the more pronounced will be the change in the measured impedance parameters. The sensing system 100 can distinguish between the objects that the user is touching as follows. For one or more objects, when the user touches an object the sensing system 100 records the measured impedance parameters of the impedance curve and stores the measured impedance parameters in the local memory 128 (FIG. 1). Subsequently, if the user 118 touches the same object, the sensing system 100 compares the subsequently measured impedance parameters with those stored in the memory 128 and if a match is found, identifies the object 110. There are a number of ways this can be accomplished. The object can be distinguished without any instrumentation, by measuring impedance parameters of the impedance curve (426, FIG. 4B). Alternatively, the object 110 can be instrumented with additional passive components (e.g. capacitors and inductors) to create a unique "signature" that would allow the sensing system 100 to distinguish which object the user is touching. If the object consists of different parts, such as individual drawers, doors, legs, etc, the sensing system 100 can distinguish which part the user is touching. In another example, the other object can be a person. For example, shaking hands can result in a unique impedance curve and have a unique measured impedance parameter. Further, the measured impedance parameter can reflect differences depending on how many people are touching each other. Therefore, the sensing system 100 can distinguish when several people are joining hands and form a larger configuration of people.

It is also possible to track an object inside of the user's body. The measured impedance parameter of the impedance curve changes when the user is changing the properties of the body. For example, if an electrode 105 is attached to a user's cheek, the sensing system 100 can track when the user 118 moves water inside of their mouth.

Figure 6:
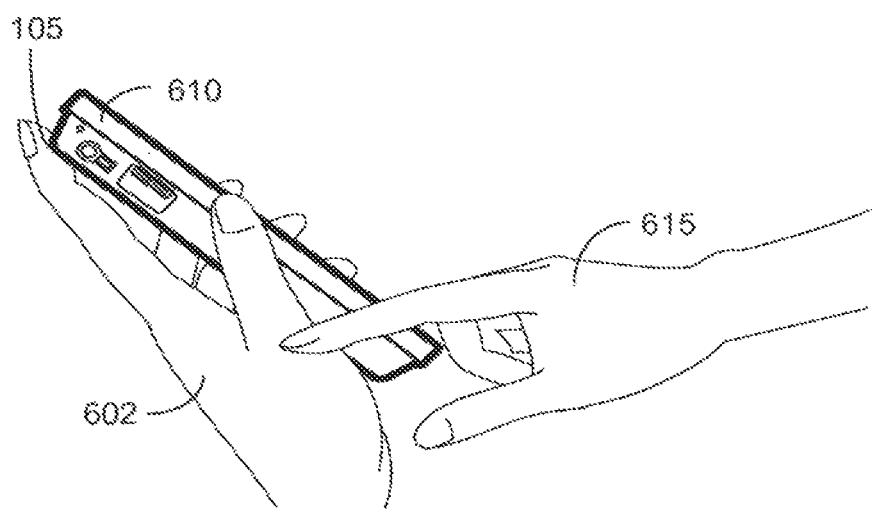
FIG. 6 is a schematic diagram illustrating a second example of a manner in which the system for sensing human activity by monitoring impedance can be used.

FIG. 6 is a schematic diagram illustrating a second example of a manner in which the system for sensing human activity by monitoring impedance can be used. In the example shown in FIG. 6, the user 118 does not wear the electrode 105 on their body, but instead holds a mobile device 610 in their hand 602. In this example, the mobile device is a mobile phone. The mobile device 610 has an electrode 105 embedded in its case. An advantage of this configuration is that the user does not have to wear anything. The interaction starts naturally when the user 118 picks up the mobile device 610. Another advantage is that the effects of the interaction are defined and encapsulated by the mobile device 610, i.e. a different device would have different effects. For example if the user 118 holds a mobile device 610 and touches their holding hand 602 with another hand 615, then a call can be put on hold. However, if the device is a gaming device, performing the same actions could result in a game related action, such as shooting or flying. Other applications can also be designed.

FIGS. 7A and 7B are schematic diagrams collectively illustrating another example of a manner in which the system for sensing human activity by monitoring impedance can be used. The sensing system 100 can recognize properties of touch when a user 118 is touching the electrode 105. For example if the object is an interactive toy 705, the sensing system 100 can recognize the user 118 touching the object as well as how strongly the user is touching the object, such as using a single finger in FIG. 7A and using two fingers in FIG. 7B, and then cause an interface (170, FIG. 1) associated with the sensing system 100 to react in a manner appropriate to the touch.

The electrode 105 can be attached to a non-conductive object, which, in an embodiment, can be used as a handle for the electrode 105. For example the electrode 105 can be attached to the end of the wooden stick that is used like a magic wand. The handle of the non-conductive object therefore can be manipulated by the user in a way that the internal state of the user does not affect the sensing system 100. Advantages of this arrangement include there being a much clearer and direct connection between the electrode 105 and the objects in the environments that the user is interacting with, as opposed to the case where the electrode is attached to the user's hand. Furthermore, the internal state of the user 118 would not affect the measured signal because the user 118 and the sensing system 100 are separated.

The sensor 105 can also be attached to a conductive object located in the environment. The sensing system 100 recognizes individuals who are touching the object by analyzing the measured impedance parameters that can be associated with a particular individual. The sensing system 100 can distinguish between people of different sizes, e.g. large body and small body. The sensing system 100 can distinguish between children and adults. For example an attraction in an amusement park can behave differently depending on whether a child or an adult interacts with the attraction.

The sensing system 100 also can distinguish between humans and non-humans, or between humans and multiple humans. For example, the sensing system 100 can be used to accurately track the presence of humans in ride vehicles in an amusement park.

When implemented as a stylus used as an input device, the stylus can be instrumented with one or more electrodes and/or sensing systems and change the properties of an interface depending on how the user is interacting with the stylus. For example, a light touch on the stylus could create a thin line and strong touch on the stylus could create a thick line.

In another example, a computer input device can track the proximity of a touching finger and then clearly distinguish between touch and proximity of the user to the object.

The object can become interactive in an adhoc manner, i.e. an object 110 was not interactive before but becomes responsive to user interaction after the sensing system 100 is attached to it. For example, a refrigerator could become interactive when the sensing system 100 and electrode 105 are attached to it.

In another example, an electrode 105 can be placed into water or other conductive liquid and then one or more parameters of the liquid can be measured by monitoring a change in the measured impedance parameter. The sensing system 100 system could also respond depending on how much of the object 110 is placed into the water, e.g. a partially submerged object would produce a different reaction from completely submerged object. An amount of liquid flowing through an object, such as a pipe, can also be measured. Interaction with running liquid can also be measured.

Changes in the internal state of the object 110 can also be measured. These changes can be caused by the user 118 as they interact with the object 110, environment or internal changes in the object 110.

In another example, the electrode 105 can be attached to an object 110 and the object 110 can "sense" changes in its configuration. For example, a refrigerator can recognize when the door is open or closed, or a cabinet can be instrumented to recognize when a specific drawer is open.

In another example, the sensing system 100 can measure the wear of an object 110 as the user 118 interacts with it. For example, the sensing system 100 can be attached to the graphite core of a pencil and a conductive plane can be placed underneath the paper. The sensing system 100 can measure the exact area of touch of the pencil tip on the paper and as the user sketches and the tip of the pencil wears, the area of pen touching paper can be continually tracked. This information can be mapped into the thickness and other properties of lines that are being drawn on the paper.

The sensing system 100 can measure the growth of an object 110 such as a plant. The sensing system 100 can also measure how the configuration of the plant changes with time or how the internal state of the plant changes with time.

FIGS. 8A and 8B are schematic diagrams collectively illustrating another example of a manner in which the system for sensing human activity by monitoring impedance can be used. The electrode 105 can be attached to a stretchable object 810 and can be used to measure the amount that the object 810 stretches. Stretching is an inductive interaction. In this example, it is desirable to estimate the changes in the inductive properties of the object 810. In an example, the object 810 is a flexible coil and the sensing system 100 can measure how far the user 118 is stretching the flexible coil. As an example, the flexible coil can be a conductive thread 811 that is woven into fabric 807 of a garment worn by the user 118. As the fabric 807 stretches, the conductive thread 811 also stretches. The amount that the conductive thread 811 stretches can be indicated by analyzing the measured inductive parameters that indicate the extent of stretching the fabric 807 and the conductive thread 811. In this example, the sensing system 100 can be used to measure interaction with plush toys and interactive clothing. For example, the conductive thread 811 can be woven into the fabric 807 and as the user 118 dances, moves, plays games, etc., environmental surroundings, such as music and lighting, can be controlled by the motion and stretching of the garment, via the interface 170 (FIG. 1).

In another example, the coil of conductive thread 811 can be wrapped around the user's finger or leg or other body part. As the user 118 bends their finger (or leg) the configuration of the coil of conductive thread 811 changes and results in a change in the measured impedance parameter. In this manner, the amount of movement can be measured, thus allowing the development of devices such as, for example, a data glove and motion capture suit, e.g. an instrumented garment that can recognize and record changes in user posture in time, and communicate such information to other systems.

Figure 9A:
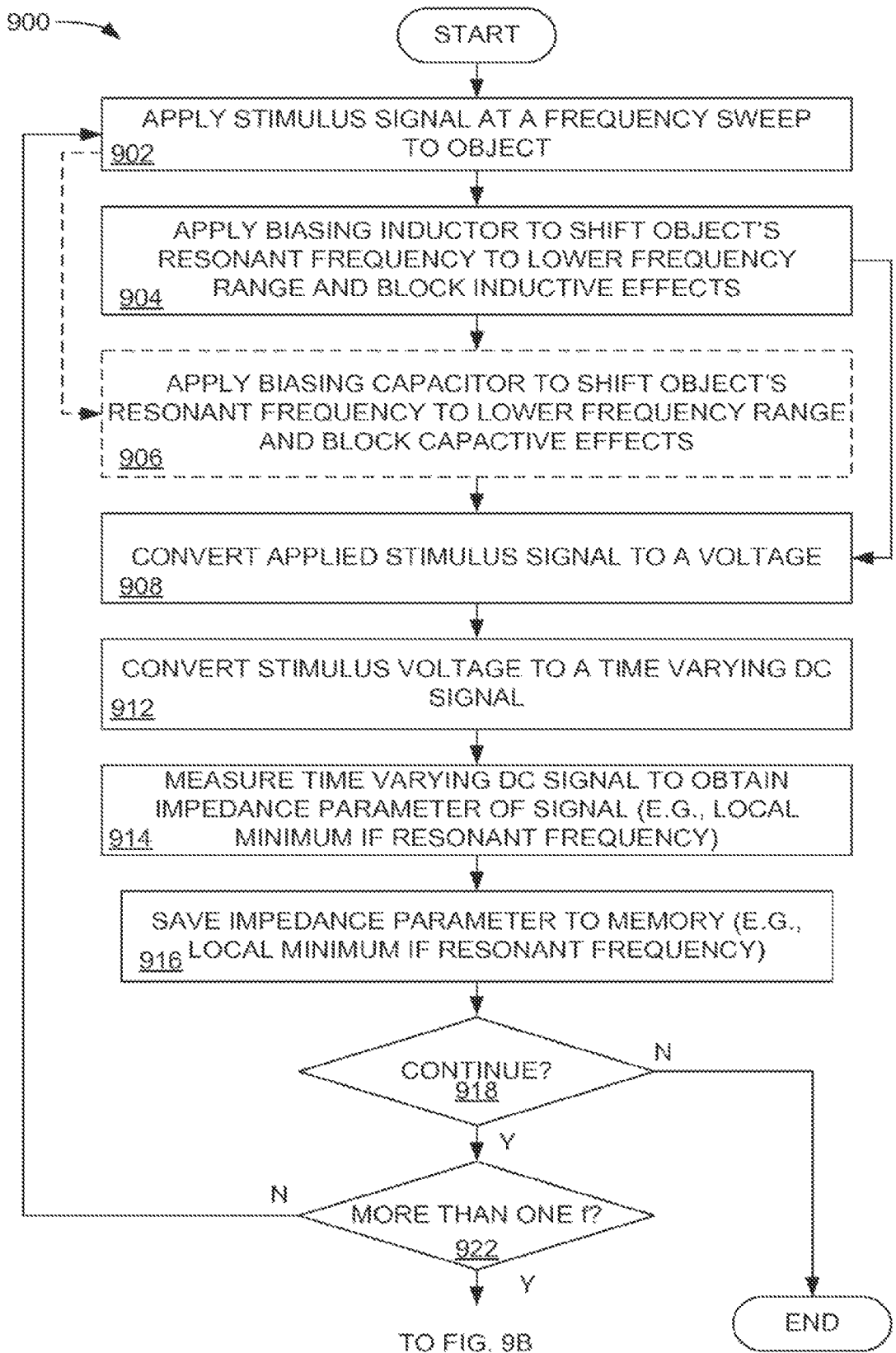
FIGS. 9A and 9B collectively illustrate a flow diagram describing the operation of an embodiment of the method for sensing human activity by monitoring impedance.
Figure 9B:
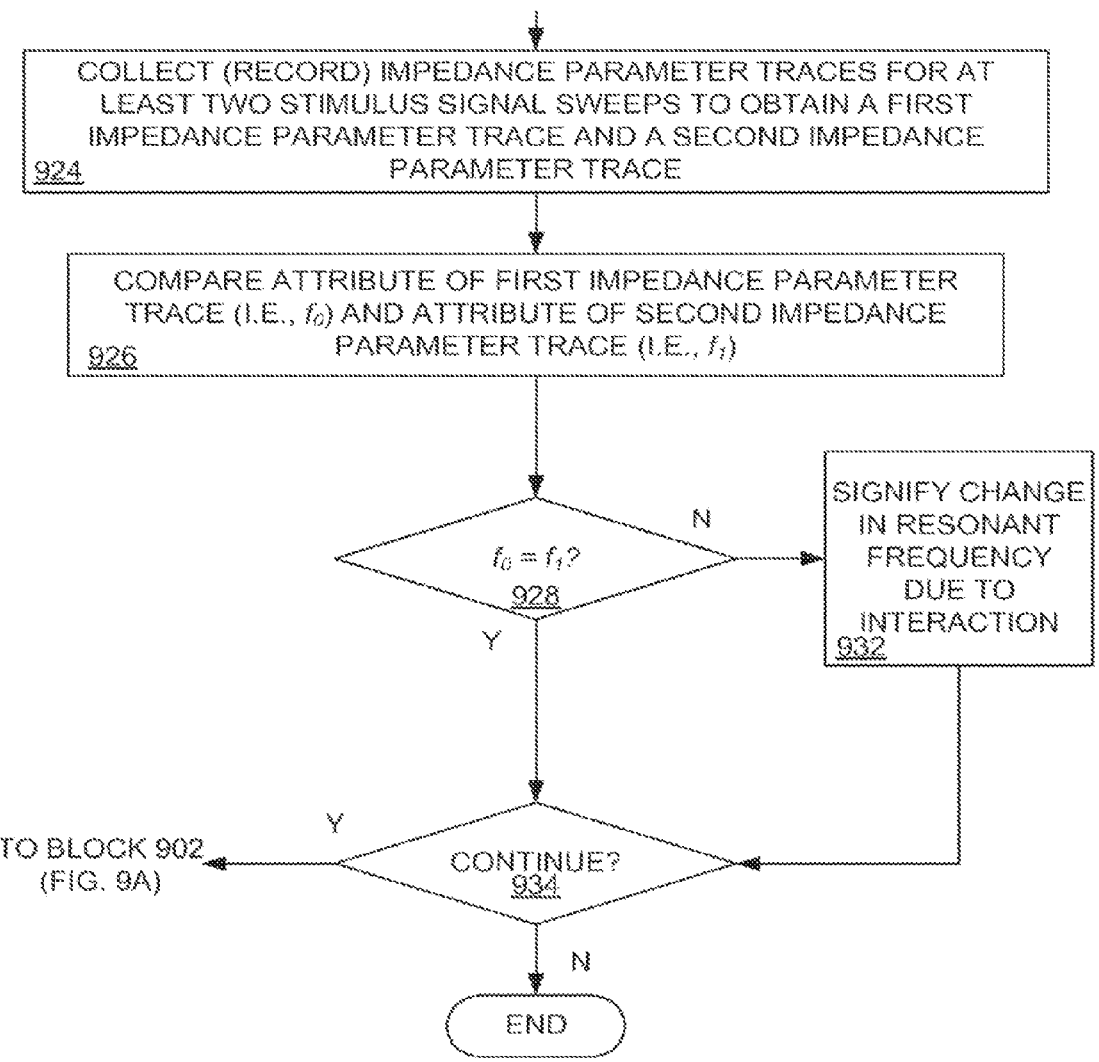

FIGS. 9A and 9B collectively illustrate a flow diagram 900 describing the operation of an embodiment of the method for sensing human activity by monitoring impedance. The blocks in the flow chart of FIGS. 9A and 9B can be performed in or out of the order shown. In addition, at least some of the blocks can be performed in parallel.

In block 902, the signal generator (120, FIG. 1) generates a time varying signal f(t). In an embodiment, the time varying signal f(t) is a 1 KHz to 3.5 MHz, 10V peak-to-peak, sinusoidal frequency sweep. However other ranges of frequencies and signal amplitudes can be used.

In block 904, a biasing inductor shifts the object's resonant frequency to a lower frequency range and blocks inductive effects, thereby facilitating the measurement of small changes in capacitance.

Alternative to block 904, in block 906, a biasing capacitor shifts the object's resonant frequency to a lower frequency range and blocks capacitive effects, thereby facilitating the measurement of small changes in inductance. In block 908, the time varying signal f(t) is converted to a voltage.

In block 912, the time varying voltage signal f(t) is converted to a time varying DC signal. The time varying DC signal defines the alternating voltage at node 138 (FIG. 1).

In block 914, the time varying DC signal is processed to compute one or more impedance parameters of the measured signal. In an embodiment, a local minimum, or other attribute of the signal, is located. In an embodiment, the local minimum of the time varying DC signal corresponds to the resonant frequency, $f_o$, of the object 110. However, other impedance parameters of the signal can also be located that define other electromagnetic resonant attributes.

In block 916, the impedance parameter of the object 110 is saved to the memory 128 (FIG. 1). In an embodiment, the resonant frequency, $f_o$, of the object 110, or another impedance parameter of the signal, is saved to the memory 128 (FIG. 1). For example, the amplitude of the signal trace can be saved to memory 128 (FIG. 1) and used as an indicator of human interaction. The memory 128 can be either or both of local memory and/or memory located on other computing devices and that is accessible using various data transmission technologies, such as wired or wireless connection links. The impedance parameter can also be compared to other impedance parameters that have previously been saved to the memory 128 (FIG. 1) to identify the current impedance parameter.

In block 918, it is determined whether the process is to continue. If the process is to continue, in block 922 it is determined whether there is more than one resonant frequency measurement in memory 128 (FIG. 1). If the process is to continue and there is only one resonant frequency measurement in memory 128 (FIG. 1), the process proceeds to block 902. If the process is to continue and there is more that one resonant frequency, or other parameter of the signal, measurement in memory 128 (FIG. 1), the process proceeds to block 924. In some applications it may be desirable to measure and record a single resonant frequency of an object. In such an application, the process ends after block 918.

In block 924, a first impedance parameter trace and a second impedance parameter trace are collected. In block 926, an attribute of the first impedance parameter trace is compared with a corresponding attribute of the second impedance parameter trace. As an example, the resonant frequency, $f_0$, of the first impedance parameter trace is compared with a resonant frequency, $f_1$, of the second impedance parameter trace. Alternatively, other attributes of the respective impedance parameter traces can be compared.

In block 928, it is determined whether the first resonant frequency, $f_0$, and the second resonant frequency, $f_1$ are substantially equal. If the first resonant frequency, $f_0$, and the second resonant frequency, $f_1$, are substantially unequal, then the process proceeds to block 932, where the change in resonant frequency is noted and signifies human interaction with the object. In alternative embodiments, other impedance parameters of the measured signal can be compared to determine whether there has been human interaction.

If it is determined in block 928 that the first resonant frequency, $f_0$, and the second resonant frequency, $f_1$, are substantially equal, then it is assumed that there is no human interaction with the object 110 and the process proceeds to block 934, where it is determined whether the process is to continue. If the process is to continue, the process returns to block 902 (FIG. 9A).

While various embodiments of the invention have been described, it will be apparent to those of ordinary skill in the art that many more embodiments and implementations are possible that are within the scope of the invention.

What is claimed is:

1. A system for sensing interaction, comprising:
 a signal generator producing a frequency-swept signal in an object;
 an impedance measurement component coupled to the object and configured to identify a change in an impedance parameter of the frequency-swept signal as an external body interacts with the object;
 a switching element selectively coupling a reactive component to an electrical path propagating the frequency-swept signal, wherein the reactive component is selectively coupled to both the signal generator and the impedance measurement component via the switching element, wherein the reactive component is operable to shift a resonant frequency associated with the object based on a state of the switching element; and
 an interaction signal generator indicating a characteristic of an interaction between the object and the external body based upon the change in the impedance parameter.

2. The system of claim 1 wherein the frequency-swept signal comprises a time-varying frequency component that varies within a range of substantially 1 KHz to 3.5 MHz.

3. The system of claim 1 wherein the frequency-swept signal is a periodic electrical signal.

4. The system of claim 1 wherein the characteristic of the interaction indicated by the interaction signal generator comprises one of: a location of the object contacted by the external body, a pressure of the contact between the object and the external body, and a size of an area of contact between the object and the external body.

5. The system of claim 1 wherein the impedance measurement component is coupled to the object with a single electrode.

6. The system of claim 1 wherein the impedance measurement component identifies the change in the impedance parameter by comparing a first multi-frequency impedance curve of the object measured when the object and the external body are not interacting to a second multi-frequency impedance curve measured when the object and the external body are interacting.

7. The system of claim 1 wherein the impedance parameter is at least one of: a resonant frequency of the frequency-swept signal, amplitude of the frequency-swept signal at a particular frequency, a difference between amplitudes at respective frequencies of the frequency-swept signal, and a shape of an impedance curve generated by the frequency-swept signal.

8. The system of claim 1, wherein, based on the state of the switching element, the reactive component is operable to block an influence of a reactive effect imparted to the object thereby improving an ability to identify the change in the impedance parameter.

9. A method for sensing a body's interaction with an object, comprising:
 generating a frequency-swept signal within the object using a signal generator;
 selectively coupling a reactive component to an electrical path of the frequency-swept signal using a switching element;
 identifying a change in an impedance parameter of the frequency-swept signal as the body interacts with the object using an impedance measurement component, wherein the reactive component is selectively coupled to both the signal generator and the impedance measurement component via the switching element, wherein the reactive component is operable to shift a resonant frequency associated with the object based on a state of the switching element; and
 generating an interaction signal indicating a characteristic of an interaction between the body and the object based upon the change in the impedance parameter.

10. The method of claim 9, wherein the act of generating a frequency-swept signal comprises generating multiple frequencies over a period of time in the range of substantially 1 KHz to 3.5 MHz.

11. The method of claim 9 wherein the act of generating the frequency-swept signal comprises applying an electrical signal periodically to the object.

12. The method of claim 9 wherein the characteristic of the interaction indicated by the interaction signal comprises one of: a location of the object contacted by the body, a pressure of the contact between the object and the body, and a size of an area of contact between the object and the body.

13. The system of claim 9 wherein the act of generating an interaction signal comprises measuring the impedance parameter of the frequency-swept signal using a single conductor.

14. The method of claim 9, wherein the act of identifying the change in an impedance parameter comprises comparing a first multi-frequency impedance curve of the object measured when the object and the body are not interacting to a second multi-frequency impedance curve measured when the object and the body are interacting.

15. The method of claim 9, wherein the impedance parameter is at least one of: a resonant frequency of the frequency-swept signal, amplitude of the frequency-swept signal at a particular frequency, a difference between amplitudes at respective frequencies of the frequency-swept signal, and a shape of an impedance curve generated by the frequency-swept signal.

16. An interactive object comprising:

a body having a characteristic reactance;

a first interface configured to couple the characteristic reactance to an external scanning impedance monitoring device, wherein the external scanning impedance monitoring device comprises a switching element, wherein the switching element selectively couples a reactive component to an electrical path propagating a frequency-swept signal, and wherein the reactive component is selectively coupled, via the switching element, to both a signal generator that generates the frequency-swept signal and an impedance measurement component in the external scanning impedance monitoring device, wherein the reactive component is operable to shift a resonant frequency associated with the interactive object based on a state of the switching element; and a second interface configured to couple to a reactance altering element, whereby the characteristic reactance coupled to the scanning impedance monitoring device is distinguishably altered when the second interface is coupled to the reactance altering element.

17. The interactive object of claim 16, wherein the first interface is an electrode configured to permit an electrical signal to flow between the interactive object and the external scanning impedance monitoring device, wherein an impedance parameter of the electrical signal is affected when the second interface is coupled to the reactance altering element.

* * * * *